(12) United States Patent
Kim et al.

(10) Patent No.: US 7,410,870 B2
(45) Date of Patent: Aug. 12, 2008

(54) METHODS OF FORMING NON-VOLATILE MEMORY DEVICES AND DEVICES FORMED THEREBY

(75) Inventors: Jong-Won Kim, Gyeonggi-do (KR); Jong-Ho Park, Seoul (KR); Yong-Seok Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/551,903

(22) Filed: Oct. 23, 2006

(65) Prior Publication Data

US 2007/0093020 A1    Apr. 26, 2007

(30) Foreign Application Priority Data

Oct. 24, 2005    (KR) .................. 10-2005-0100407

(51) Int. Cl.
 *H01L 21/336*    (2006.01)
(52) U.S. Cl. .................. 438/257; 438/258; 438/259; 257/315; 257/E21.682
(58) Field of Classification Search ............... 438/270, 438/257, 259, 589, 596, 232, 243, 258; 257/315, 257/E21.682
See application file for complete search history.

(56) References Cited

U.S. PATENT DOCUMENTS

| | | | |
|---|---|---|---|
| 6,661,052 B2* | 12/2003 | Matsui et al. ............... 257/510 |
| 6,743,675 B2* | 6/2004 | Ding ........................... 438/257 |
| 6,853,029 B2* | 2/2005 | Ichige et al. ................ 257/316 |
| 6,891,246 B2* | 5/2005 | Aritome ...................... 257/510 |
| 7,118,963 B2* | 10/2006 | Mori ........................... 438/257 |
| 2005/0047261 A1* | 3/2005 | Kai et al. .................... 365/232 |
| 2005/0139900 A1* | 6/2005 | Jung et al. ................... 257/319 |
| 2006/0138522 A1* | 6/2006 | Kim ............................ 257/315 |

FOREIGN PATENT DOCUMENTS

| | | | |
|---|---|---|---|
| JP | 10178114 A | * | 6/1998 |
| JP | 2003-007870 | | 1/2003 |
| JP | 2004-014783 | | 1/2004 |
| KR | 1020030004035 A | | 1/2003 |
| KR | 1020030095290 A | | 12/2003 |
| KR | 1020050024706 A | | 3/2005 |

* cited by examiner

*Primary Examiner*—Brook Kebede
*Assistant Examiner*—Shaka Scarlett
(74) *Attorney, Agent, or Firm*—Myers Bigel Sibley & Sajovec

(57) ABSTRACT

Methods of forming non-volatile memory devices include steps to define features that enhance shielding of electronic interference between adjacent floating gate electrodes and improve leakage current and threshold voltage characteristics. These features also support improved leakage current and threshold voltage characteristics in string selection transistors that are coupled to non-volatile memory cells.

8 Claims, 17 Drawing Sheets

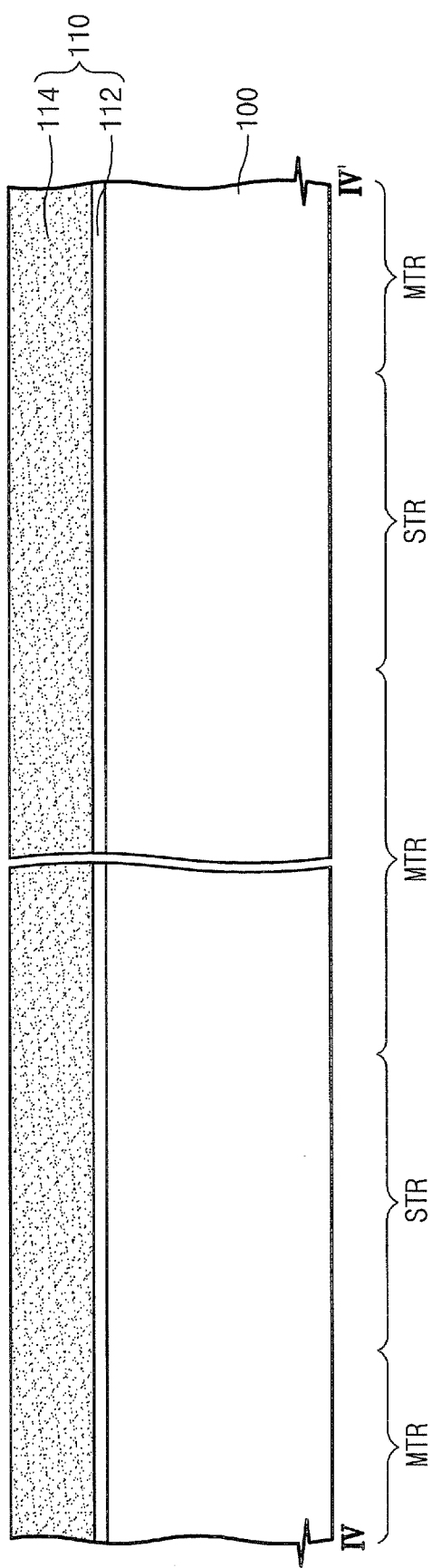

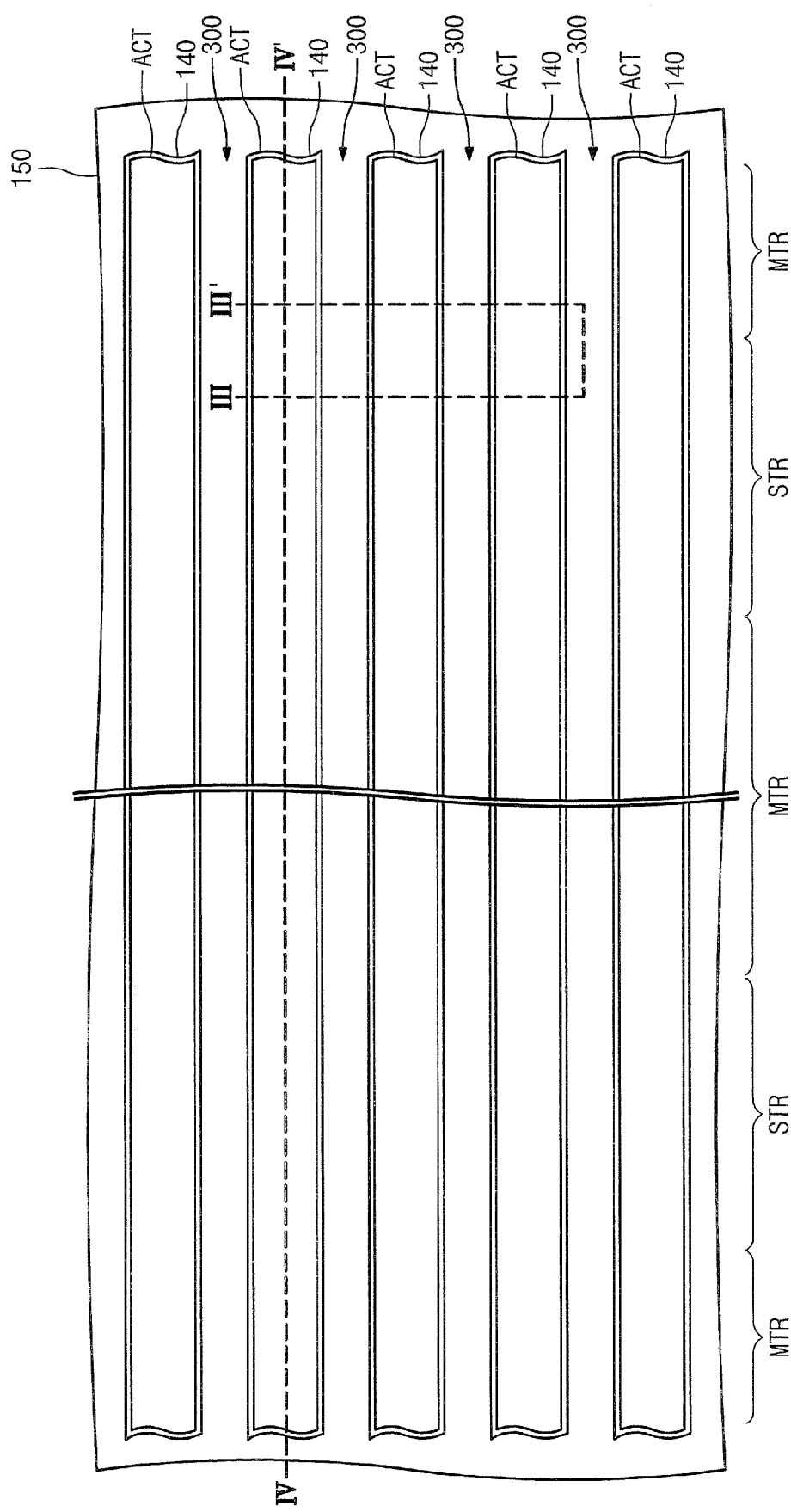

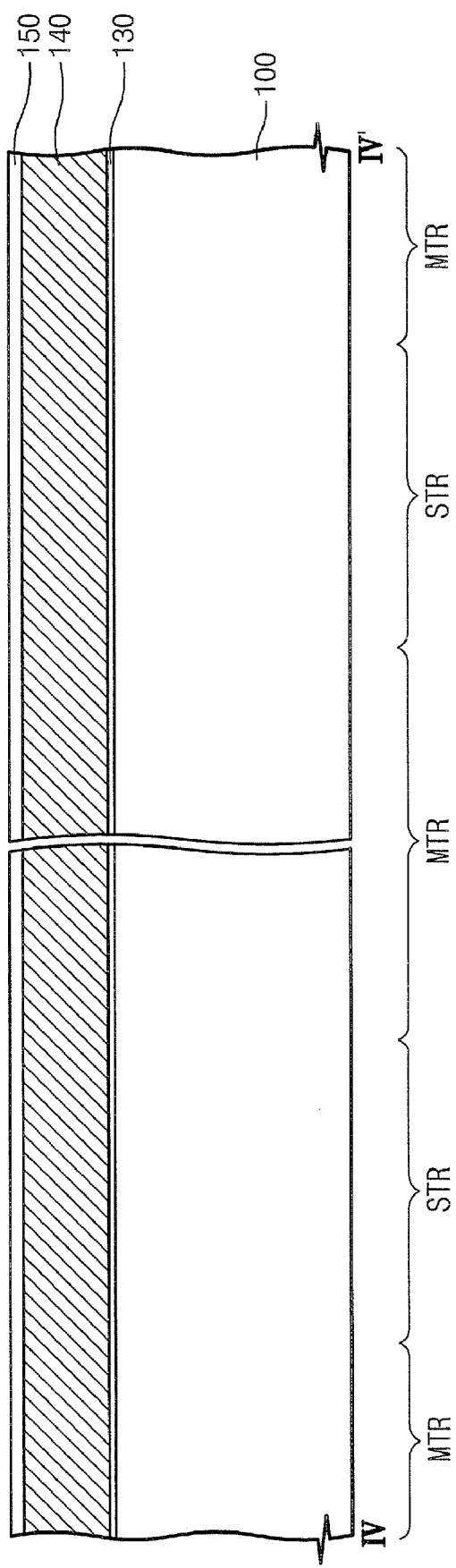

METHODS OF FORMING NON-VOLATILE MEMORY DEVICES AND DEVICES FORMED THEREBY

REFERENCE TO PRIORITY APPLICATION

This application claims priority to Korean Patent Application No. 2005-100407, filed on Oct. 24, 2005, the disclosure of which is hereby incorporated herein by reference.

FIELD OF THE INVENTION

The present invention relates to methods of forming integrated circuit devices and, more particularly, to methods of forming non-volatile memory devices and devices formed thereby.

DESCRIPTION OF THE RELATED ART

A flash memory device is a type of nonvolatile memory device that retains stored data irrespective of a power supply and enables reprogramming of the stored data in rapid and simple ways, unlike other nonvolatile memory devices such as a read-only memory (ROM). The flash memory device may be categorized as either a NOR type or a NAND type depending on how the memory cells are connected to a bit line. More specifically, a NOR flash memory device (hereinafter, NOR flash) is structured so that memory cells are connected in parallel between a bit line and a ground electrode to enable fast random access. Thus, the NOR flash is in common use for basic input output systems (BIOS), cellular phones, and personal digital assistants (PDA).

In contrast, a NAND flash memory device (hereinafter, NAND flash) includes memory cells connected in series between a bit line BL and a ground electrode 40 as shown in FIG. 1A. Specifically, referring to FIG. 1A, a cell array 50 of the NAND flash includes a plurality of cell strings 10, each of which includes a plurality of memory cells 15 that are connected in series through an active region ACT. In this case, a ground selection transistor 16 and a string selection transistor 17, which are connected to a ground selection line GSL and a string selection line SSL, respectively, are disposed on opposite ends of the cell string 10, respectively, and serve to control electrical connection of the memory cells 15 with the bit line BL/the ground electrode 40.

Owing to the foregoing serial connection structure, the NAND flash has a high integration density. Also, since the NAND flash adopts an operating mode in which data stored in a plurality of memory cells are changed at the same time, the NAND flash can update data at a higher speed than the NOR flash. Because of the high integration density and fast update speed, the NAND flash is widely applied to portable electronic products, such as digital cameras or MP3 players, which need mass storage.

Gate electrodes of the memory cells 15 are connected to one another by word lines WL that run across the active regions ACT. More specifically, referring to FIGS. 1A and 1B, the word line WL includes a floating gate electrode 22, which is disposed on the active region ACT, an inter-gate dielectric pattern 24 and a control gate electrode 26, which are disposed on the floating gate electrode 22 and run across the active regions ACT. Here, FIG. 1B is a cross sectional view taken along a dotted line I-I' (i.e., the word line WL) of FIG. 1A.

In this case, the floating gate electrode 22 is electrically isolated from the control gate electrode 26 by the inter-gate dielectric pattern 24. A distance between the floating gate electrodes 22 connected to one word line WL decreases with an increase in the integration density of the NAND flash, but a reduction in the distance between the floating gate electrodes 22 leads to an increase in electrical interference between the floating gate electrodes 22. Thus, a technique of disposing the control gate electrode 26 between the floating gate electrodes 22 has been lately proposed in order to shield the electrical interference. For example, Korean Patent Application No. 2004-0099568 discloses a process of recessing an isolation pattern 5 between the floating gate patterns 22 and a process of filling the recessed portion with the control gate electrode 26, as shown in FIG. 1B, so that interference between the adjacent floating gate electrodes 22 can be effectively shielded.

However, the above-described technique may deteriorate the characteristics of selection transistors. More specifically, referring to FIGS. 1A and 1C, the floating gate electrode 22 and the control gate electrode 26 of the ground and string selection transistors 16 and 17 are electrically connected to each other so that a voltage applied to the control gate electrode 26 can be used as an actual gate voltage of the ground and string selection transistors 16 and 17. Here, FIG. 1C is a cross sectional view taken along a dotted line II-II' (i.e., the string selection line SSL) of FIG. 1A. To enable the electrical connection, the inter-gate dielectric pattern 24 of the ground and string selection transistors 16 and 17 includes an opening 99 to expose the floating gate electrode 22. However, the recessed portion of the isolation pattern 5 expands during the formation of the opening 99, with the result that a distance L between the control gate electrode 26 and the active region ACT decreases. A reduction in the distance L between the control gate electrode 26 and the active region ACT leads to a rise in leakage current and a drop in breakdown voltage between the control gate electrode 26 and the active region ACT.

SUMMARY OF THE INVENTION

Embodiments of the present invention include methods of forming non-volatile memory devices (e.g., NAND-type flash memory devices) having features that support shielding of electronic interference between adjacent floating gate electrodes and improved leakage current and threshold voltage characteristics. These method embodiments also provide for improved leakage current and breakdown voltage characteristics in string selection transistors that may be electrically coupled to memory cell transistors within a memory device.

According to some of these embodiments, a method of forming a flash memory device is provided. This method includes forming a trench mask pattern on a semiconductor substrate and then selectively etching the semiconductor substrate to define an isolation trench therein, using the trench mask pattern as an etching mask. The isolation trench and an opening in the trench mask pattern are then filled with an electrically insulating trench isolation region. The trench mask pattern is removed to thereby expose a sidewall of the electrically insulating trench isolation region. A gate electrode pattern is then formed. This gate electrode pattern extends on the semiconductor substrate and on the sidewall of the electrically insulating trench isolation region. A portion of the electrically insulating trench isolation region is then selectively etched to define a trench therein that exposes a sidewall of the gate electrode pattern. An inter-gate dielectric layer is then formed on the exposed sidewall of the gate electrode pattern and a first control gate electrode layer is formed on the inter-gate dielectric layer.

According to additional aspects of these embodiments, the removing step may include recessing the sidewall of the electrically insulating trench isolation region. In particular, the step of forming a trench mask pattern may be preceded by a step of forming a pad oxide layer on the semiconductor substrate and the removing step may include simultaneously etching the pad oxide layer and the sidewall of the electrically insulating trench isolation region. The step of forming a gate electrode pattern may also be preceded by a step of forming a gate insulating layer on the semiconductor substrate. This gate insulating layer may include a material selected from a group consisting of silicon dioxide, aluminum oxide and hafnium oxide, for example. These methods may also include the steps of forming a mask on the first control gate electrode layer and then selectively etching back a portion of the first control gate electrode layer and the inter-gate dielectric layer to expose the gate electrode pattern.

According to still further embodiments of the present invention, a method of forming a flash memory device includes forming a trench mask pattern on a semiconductor substrate and then selectively etching the semiconductor substrate to define first and second isolation trenches therein. This etching step is performed using the trench mask pattern as an etching mask. The first and second isolation trenches and first and second openings in the trench mask pattern are then filled with an electrically insulating trench isolation layer. The trench mask pattern is then removed to thereby expose a first sidewall of the electrically insulating trench isolation layer extending adjacent the first isolation trench and expose a second sidewall of the electrically insulating trench isolation layer extending adjacent the second isolation trench. A gate electrode pattern is then formed, which extends on the semiconductor substrate and on the first and second sidewalls of the electrically insulating trench isolation layer. First and second portions of the electrically insulating trench isolation layers are then etched back to define a first trench therein that exposes a first sidewall of the gate electrode pattern and also define a second trench therein that exposes a second sidewall of the gate electrode pattern. An inter-gate dielectric layer is then formed on the exposed first and second sidewalls of the gate electrode pattern. A first control gate electrode layer is then formed on a first portion of the inter-gate dielectric layer, which extends opposite the first sidewall of the gate electrode pattern, and on a second portion of the inter-gate dielectric layer, which extends opposite the second sidewall of the gate electrode pattern. A mask is then formed on the first control gate electrode layer. A portion of the first control gate electrode layer and a portion of the inter-gate dielectric layer are then selectively etched back to expose the second sidewall of the gate electrode pattern. The mask is then removed from the first control gate electrode layer. A second control gate electrode layer is then formed on the first control gate electrode layer and on the exposed second sidewall of the gate electrode pattern.

Still further embodiments of the invention include a NAND string of EEPROM cells having a string selection transistor therein with improved electrical characteristics. This string selection transistor includes a first electrically insulating trench isolation region in a semiconductor substrate. The first trench isolation region has a first trench therein with a bottom that is recessed relative to a surface of the semiconductor substrate. A second electrically insulating trench isolation region is also provided in the semiconductor substrate. The second trench isolation region has a second trench therein with a bottom that is recessed relative to the surface of the semiconductor substrate. A first gate electrode is provided, which extends on a portion of the surface of the semiconductor substrate extending between the first and second trench isolation regions. First and second inter-gate dielectric layer segments are provided that line the bottoms and sidewalls of the first and second trenches, respectively. First and second control gate electrode segments are provided that extend on the first and second inter-gate dielectric layer segments and fill the first and second trenches, respectively. A second control gate electrode is also provided. This second control gate electrode contacts sidewalls of the first gate electrode and contacts upper surfaces of said first and second control gate electrode segments.

BRIEF DESCRIPTION OF THE DRAWINGS

FIGS. 2A through 6A are plan views illustrating methods of fabricating NAND flash memory devices according to embodiments of the present invention; and FIGS. 2B through 6B and 2C through 6C are cross-sectional views illustrating methods of fabricating NAND flash memory devices according to embodiments of the present invention.

DETAILED DESCRIPTION OF THE INVENTION

Figure 1A:
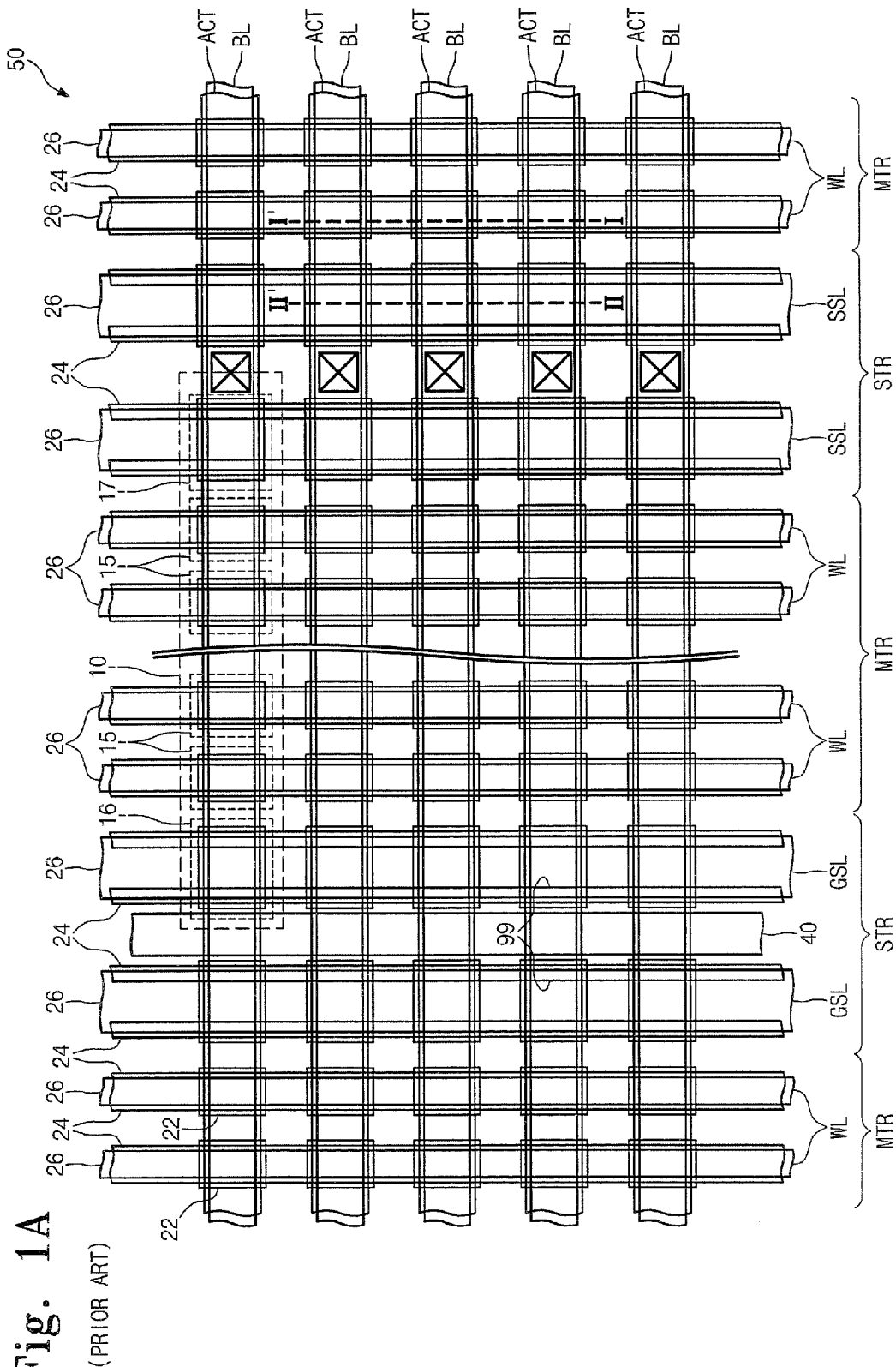
FIG. 1A is a plan view of a cell array structure of a conventional NAND flash memory device.
Figure 1B:
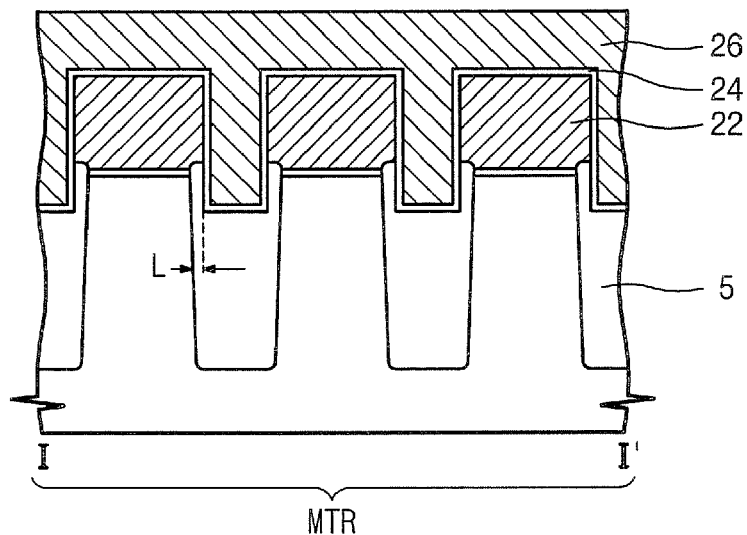
FIGS. 1B and 1C are cross sectional views of the cell array structure of the conventional NAND flash memory device of FIG. 1A.
Figure 1C:
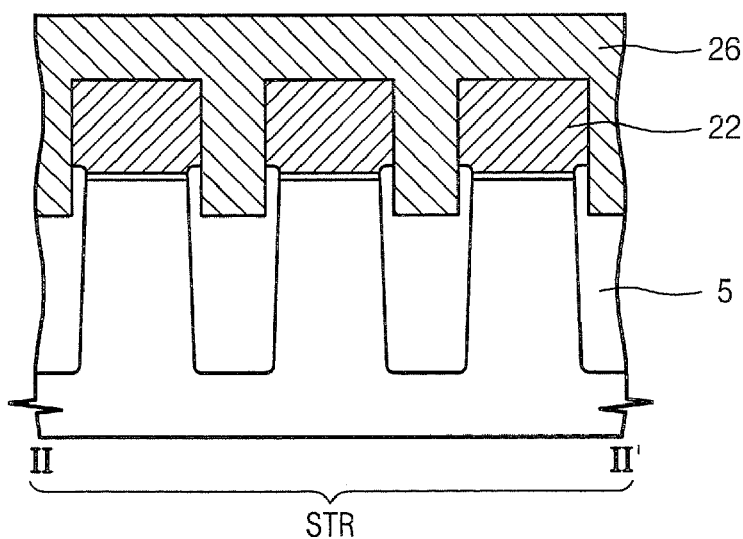

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

A NAND flash memory device according to an embodiment of the present invention includes a cell array region and a peripheral circuit region. The cell array region includes a memory transistor region (MTR) where memory cell transistors are to be formed and a selection transistor region (STR) where string selection transistors and ground selection transistors are to be formed. FIGS. 2A through 6A are plan views illustrating a method of fabricating a NAND flash memory device according to an embodiment of the present invention and FIGS. 2B through 6B and 2C through 6C are cross sectional views of the structures of FIGS. 2A to 6A. In particular, FIGS. 2B through 6B are taken along dotted lines III-III' of FIGS. 2A through 6A, respectively, and FIGS. 2C through 6C are taken along dotted lines IV-IV' of FIGS. 2A through 6A, respectively. More specifically, FIGS. 2B through 6B show the cross sections of the string selection transistors formed in the STR and the memory cell transistors formed in the MTR taken along a first direction. The ground selection transistors may have the same structure as the string selection transistors. FIGS. 2C through 6C show the cross sections of the string selection transistors and the memory cell transistors taken along a second direction.

Figure 2A:
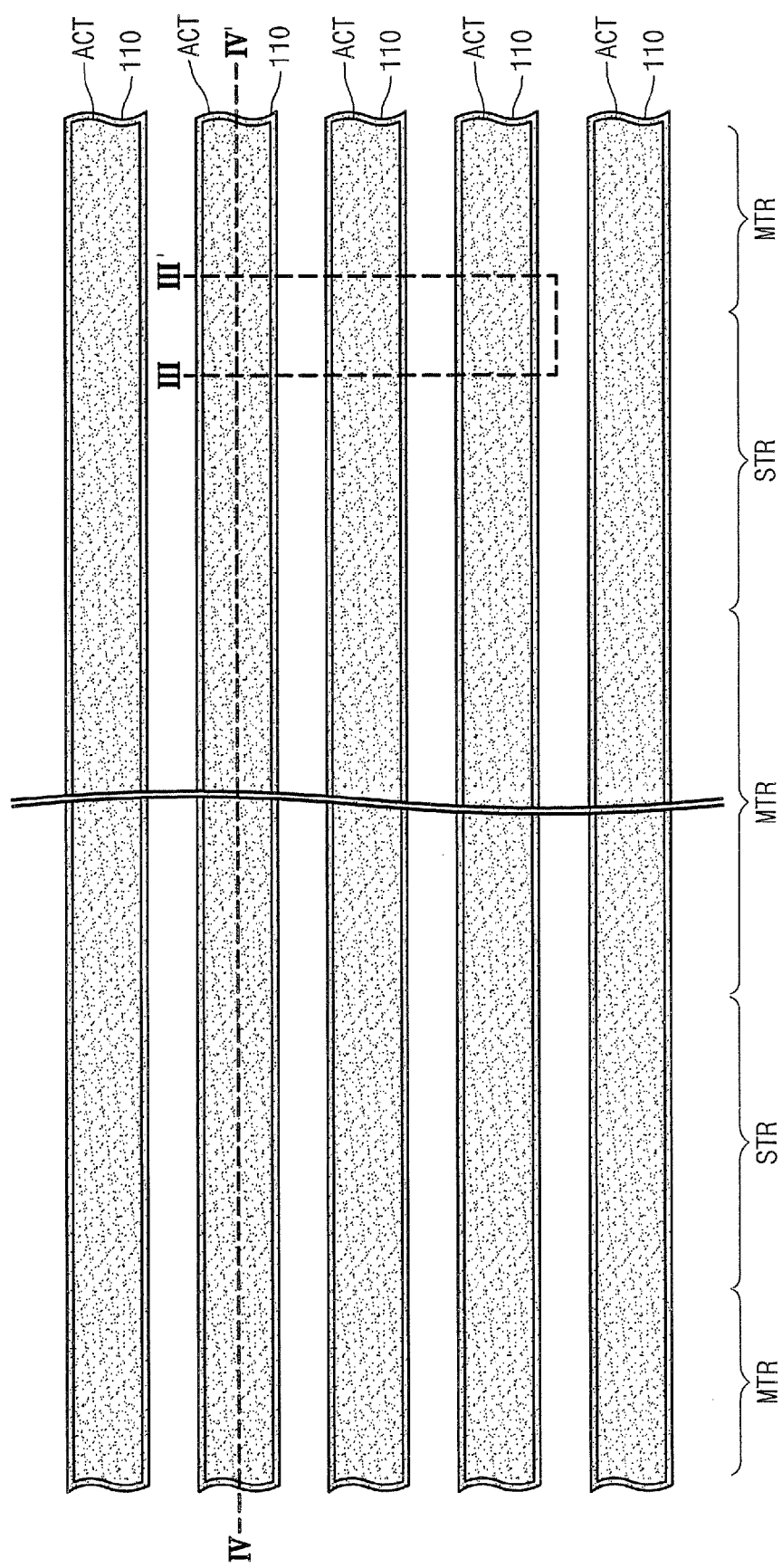
Figure 2B:
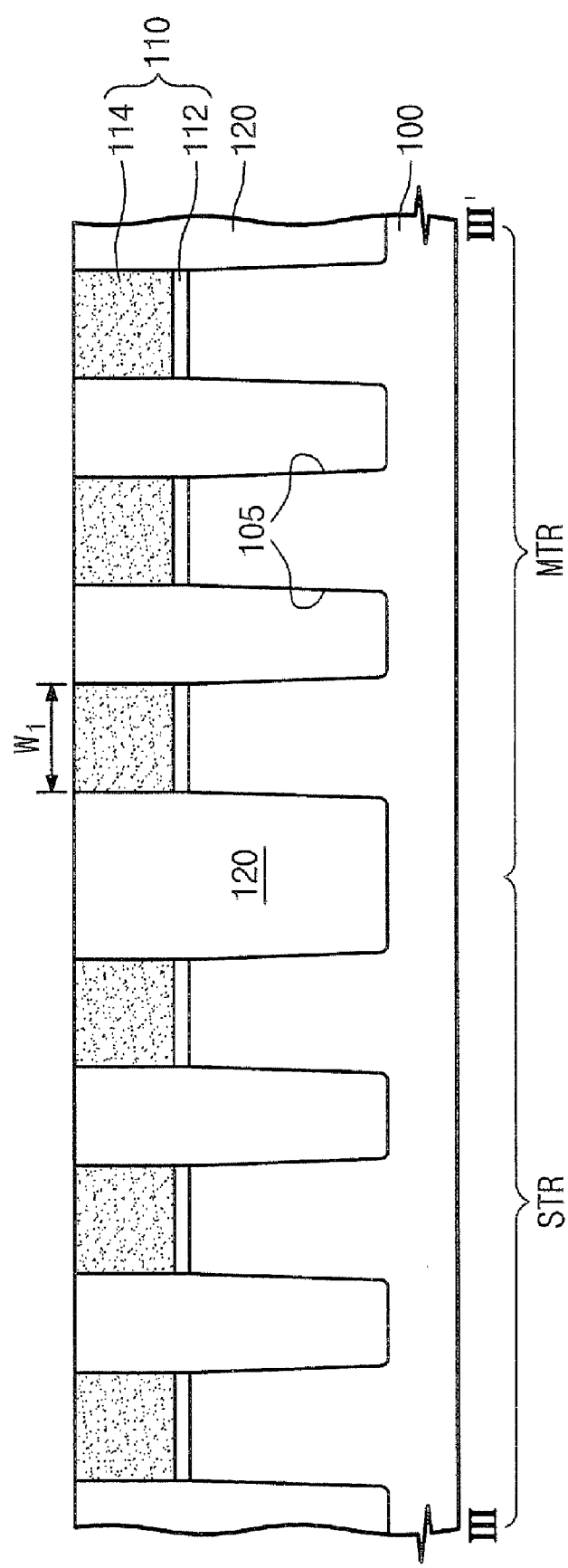

Referring to FIGS. 2A through 2C, trench isolation patterns 120 are formed in a predetermined region of a semiconductor substrate 100 to define active regions ACT. The active region ACT is a region where source and drain regions and a channel region of a transistor are to be formed. The formation of the trench isolation patterns 120 includes forming trench mask patterns 110 on the semiconductor substrate 100 and then anisotropically etching the semiconductor substrate 100 using the trench mask patterns 110 as an etch mask. Thus, trenches 105 are formed in the semiconductor substrate 100 to define the active regions ACT. As a result, the active regions ACT correspond to partial regions of the semiconductor substrate 100 disposed under the trench mask patterns 110.

The trench mask pattern 110 may be formed of at least one selected from the group consisting of a silicon nitride layer, a silicon oxide layer, and a polycrystalline silicon (polysilicon) layer. In some embodiments of the present invention, the trench mask pattern 110 may include a pad insulating layer 112, a mask insulating layer 114, and an anti-reflection layer (ARL) (not shown), which are sequentially stacked. In this case, the pad insulating layer 112 may be a silicon oxide layer, and the mask insulating layer 114 may be a silicon nitride layer.

After the trenches 105 are formed, a thermal oxide layer (not shown) may be formed to a thickness of about 50 Å on the inner surface of the trenches 105. This thermal oxide layer is formed in order to cure damage caused by the etch process for forming the trenches 105. Further, after the trenches 105 are formed, a predetermined ion implantation process may be performed to enhance an insulation characteristic of the isolation patterns 120, or a liner layer forming process may be performed to prevent impurities from diffusing into inner walls of the trenches 105. The liner layer forming process includes forming a silicon nitride layer on the resultant structure having the thermal oxide layer. This silicon nitride layer may be formed using a chemical vapor deposition (CVD) process. Thereafter, an isolation layer (e.g., oxide layer) is formed to fill the trenches 105 and planarized until top surfaces of the trench mask patterns 110 are exposed. Thus, the isolation patterns 120 fill the trenches 105.

Figure 3A:
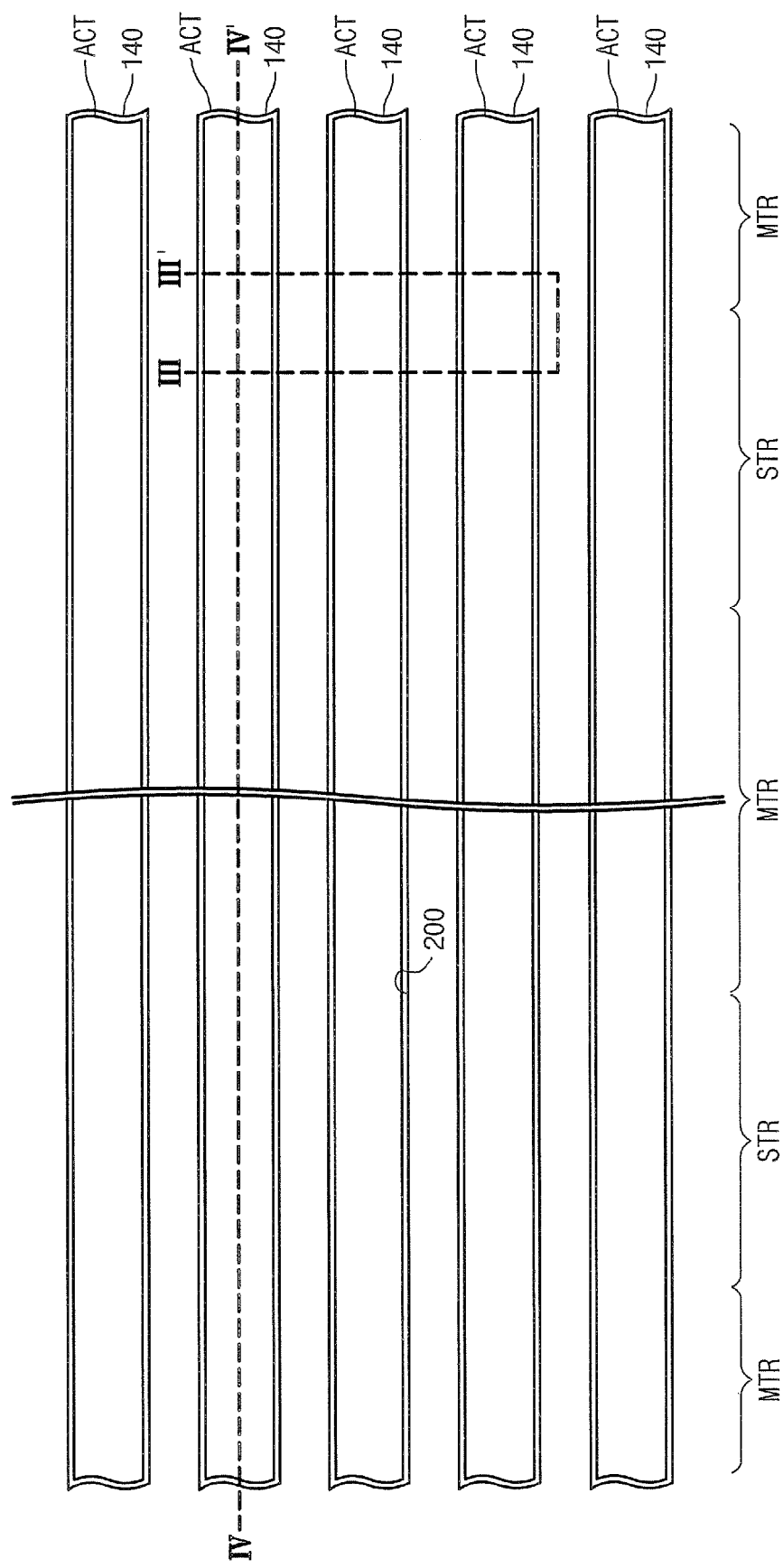
Figure 3B:
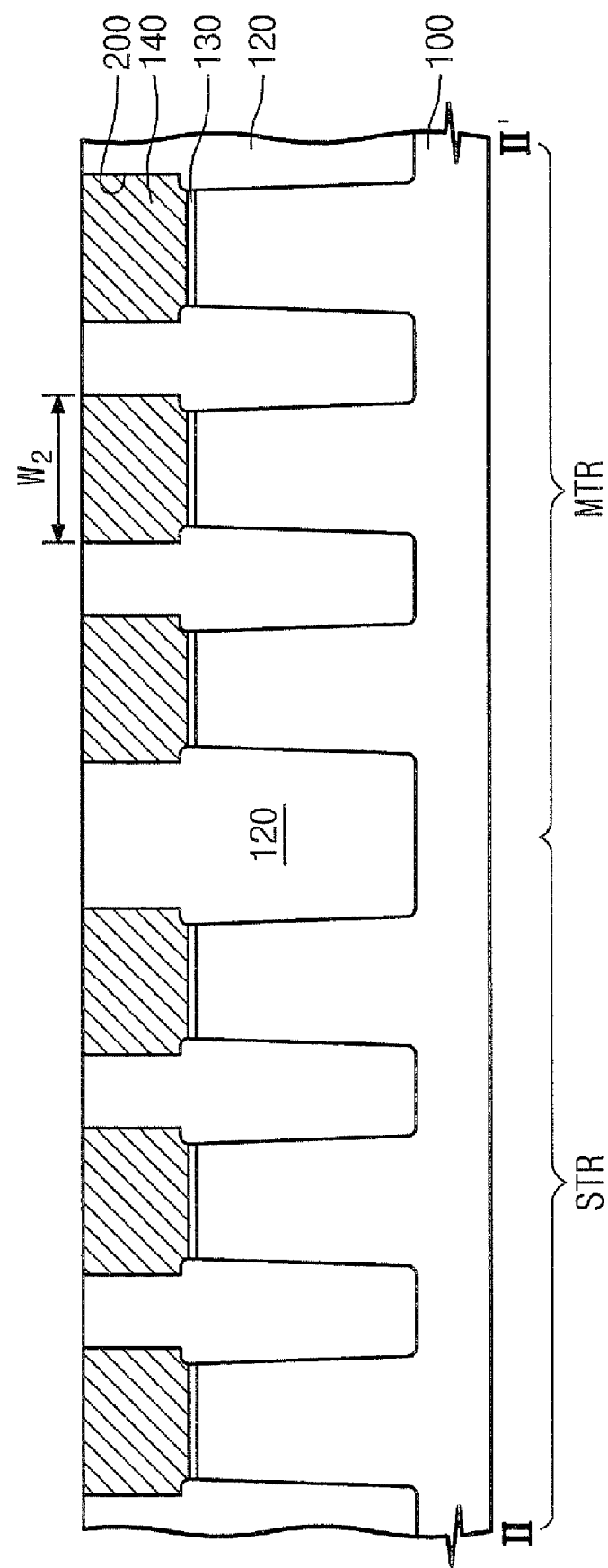
Figure 3C:
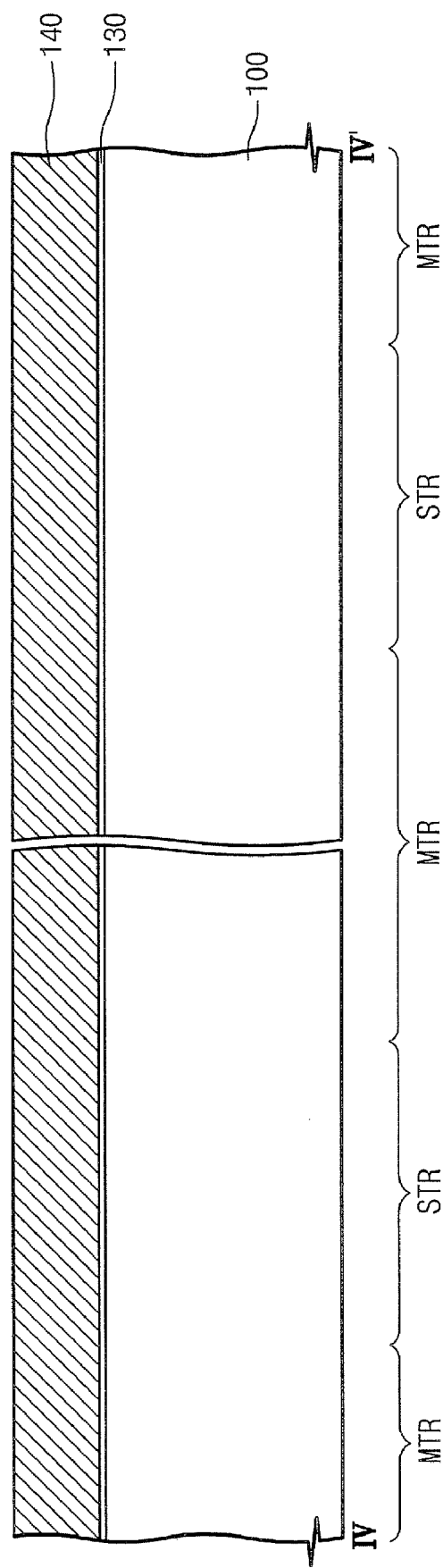

Referring to FIGS. 3A through 3C, the trench mask patterns 110 are removed to expose top surfaces of the active regions ACT. Thus, gap regions 200, which are enclosed within protruding top regions of the isolation patterns 120, are formed. Thereafter, a gate insulating layer 130 is formed on the exposed top surfaces of the active regions ACT, and a floating conductive layer is formed on the resultant structure having the gate insulating layer 130 to fill the gap regions 200. Subsequently, the floating conductive layer is planarized until top surfaces of the isolation patterns 120 are exposed, so that floating conductive patterns 140 are formed to fill the gap regions 200.

In some embodiments of the present invention, the removal of the trench mask patterns 110 may include wet etching the trench mask patterns 110 using an etch recipe having an etch selectivity with respect to the isolation patterns 120. More specifically, the removal of the trench mask patterns 110 includes sequentially removing the mask insulating layer 114 and the pad insulating layer 112. In this case, the removal of the mask insulating layer 114 may be carried out using an etch recipe having an etch selectivity with respect to a silicon oxide layer, so that a silicon nitride layer can be selectively etched. Since this etch recipe makes over-etching possible, the mask insulating layer 114 can be completely removed. The removal of the pad insulating layer 112 may be carried out using an etch recipe having an etch selectivity with respect to silicon, so that a silicon oxide layer can be selectively etched. Meanwhile, since the isolation pattern 120 is formed using the same material (i.e., silicon oxide) as the pad insulating layer 112, the exposed surface of the isolation pattern 120 is etched to a predetermined thickness during the removal of the pad insulating layer 112. As a result, a width $W_2$ of the gap region 200 becomes greater than a width $W_1$ of the trench mask pattern 110 or the active region ACT. (Compare FIGS. 2B and 3B.) An increase in the width $W_2$ of the gap region 200 gives rise to an increase in the width of the floating conductive pattern 140 filled in the gap region 200. Also, the increase in the width of the floating conductive pattern 140 is advantageous in improving leakage current and breakdown voltage characteristics between a control gate electrode and active region of a selection transistor. This effect will be described in more detail hereinbelow.

The gate insulating layer 130 may be a silicon oxide layer obtained using a thermal oxidation process, but may be formed as a high-k dielectric layers, such as an aluminum oxide layer or a hafnium oxide layer. The floating conductive layer may be a polysilicon layer obtained using a CVD process. Also, the planarization of the floating conductive layer may be performed using a chemical mechanical polishing (CMP) technique using etch slurry having an etch selectivity with respect to the isolation pattern 120. In this case, since the floating conductive pattern 140 is formed to fill the gap region 200, the floating conductive pattern 140 covers the entire surface of the active region ACT and is enclosed with the isolation pattern 120.

Figure 4B:
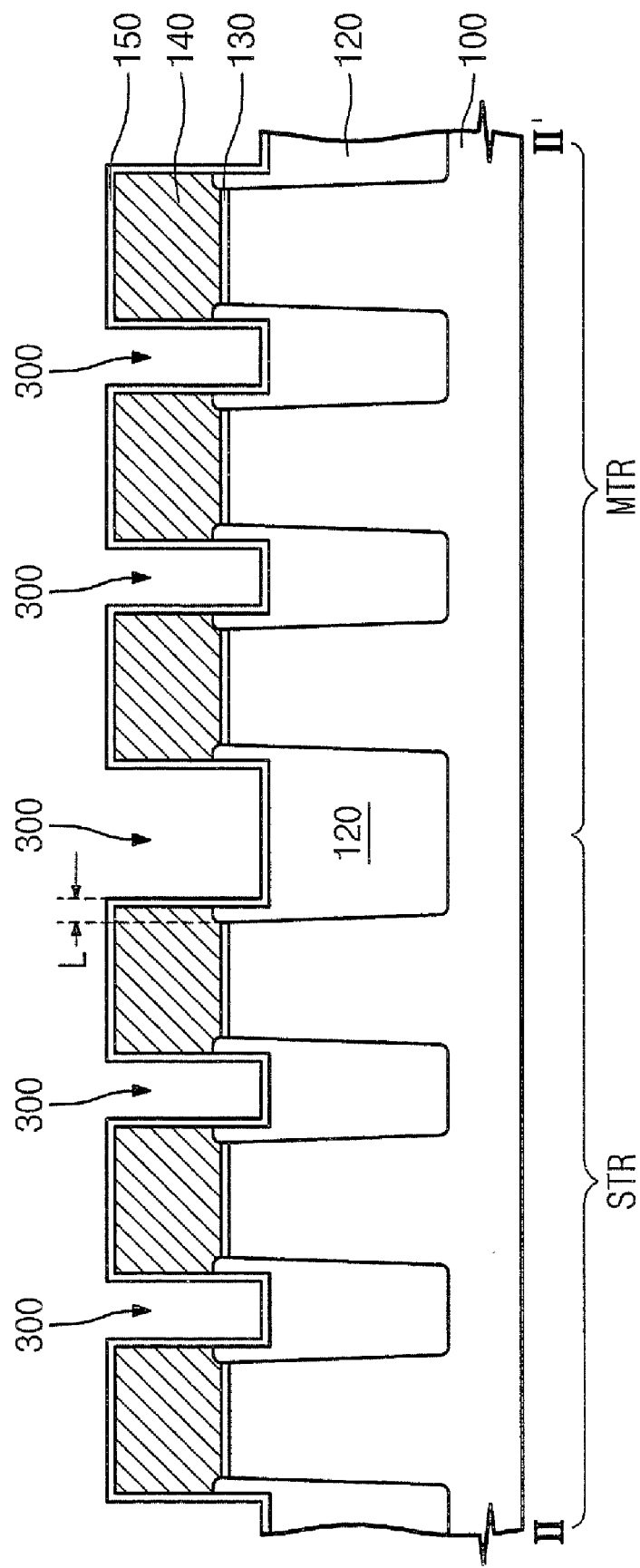

Referring to FIGS. 4A through 4C, the top surfaces of the isolation patterns 120 are etched using the floating conductive patterns 140 as an etch mask, thereby forming grooves 300 with bottom surfaces lower than bottom surfaces of the floating conductive patterns 140. Thereafter, an inter-gate dielectric layer 150 is formed on the resultant structure having the grooves 300. The formation of the grooves 300 may include anisotropically etching the isolation patterns 120 using an etch recipe having an etch selectivity with respect to the floating conductive patterns 140. In other embodiments of the present invention, the formation of the grooves 300 may further include wet etching upper regions of the isolation patterns 120 using an etchant containing fluoric acid.

In this case, due to the increase in the width $W_2$ of the gap region 200, the floating conductive pattern 140 covers an edge portion of the top surface of the isolation pattern 120. Because the groove 300 is formed using the floating conductive pattern 140 as an etch mask as described above, an inner wall of the groove 300 is spaced a predetermined distance "L" from a sidewall of the isolation pattern 120. The distance "L" corresponds to a distance between a control gate electrode to fill the groove 300 during a subsequent process and the active region ACT. Thus, the distance "L" can result in improvements in leakage current and breakdown voltage characteristics between the control gate electrode and active region ACT of the selection transistor. In this case, the distance "L" corresponds to half of a difference in width between the floating conductive pattern 140 and the active region ACT or half of an increment of the width of the gap region 200.

The inter-gate dielectric layer 150 may be formed of at least one of a silicon nitride layer and a silicon oxide layer. Preferably, the inter-gate dielectric layer 150 may include a composite of a silicon oxide layer, a silicon nitride layer, and a silicon oxide layer, which are sequentially stacked as an oxide-nitride-oxide (ONO) layer. The inter-gate dielectric layer 150 may be formed using a CVD technique so that the inter-gate dielectric layer 150 can have excellent step-coverage and thin-film characteristics.

Figure 5A:
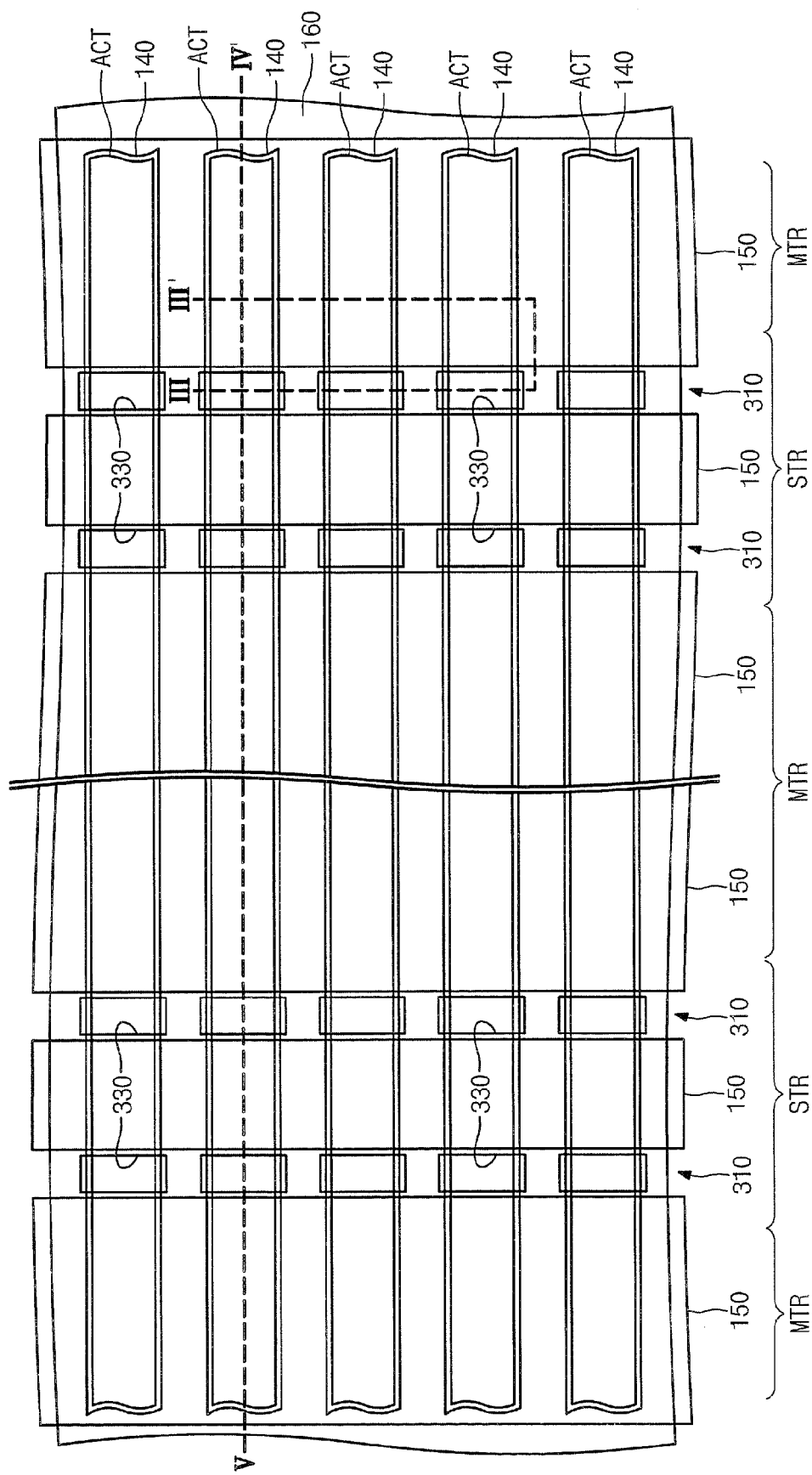
Figure 5B:
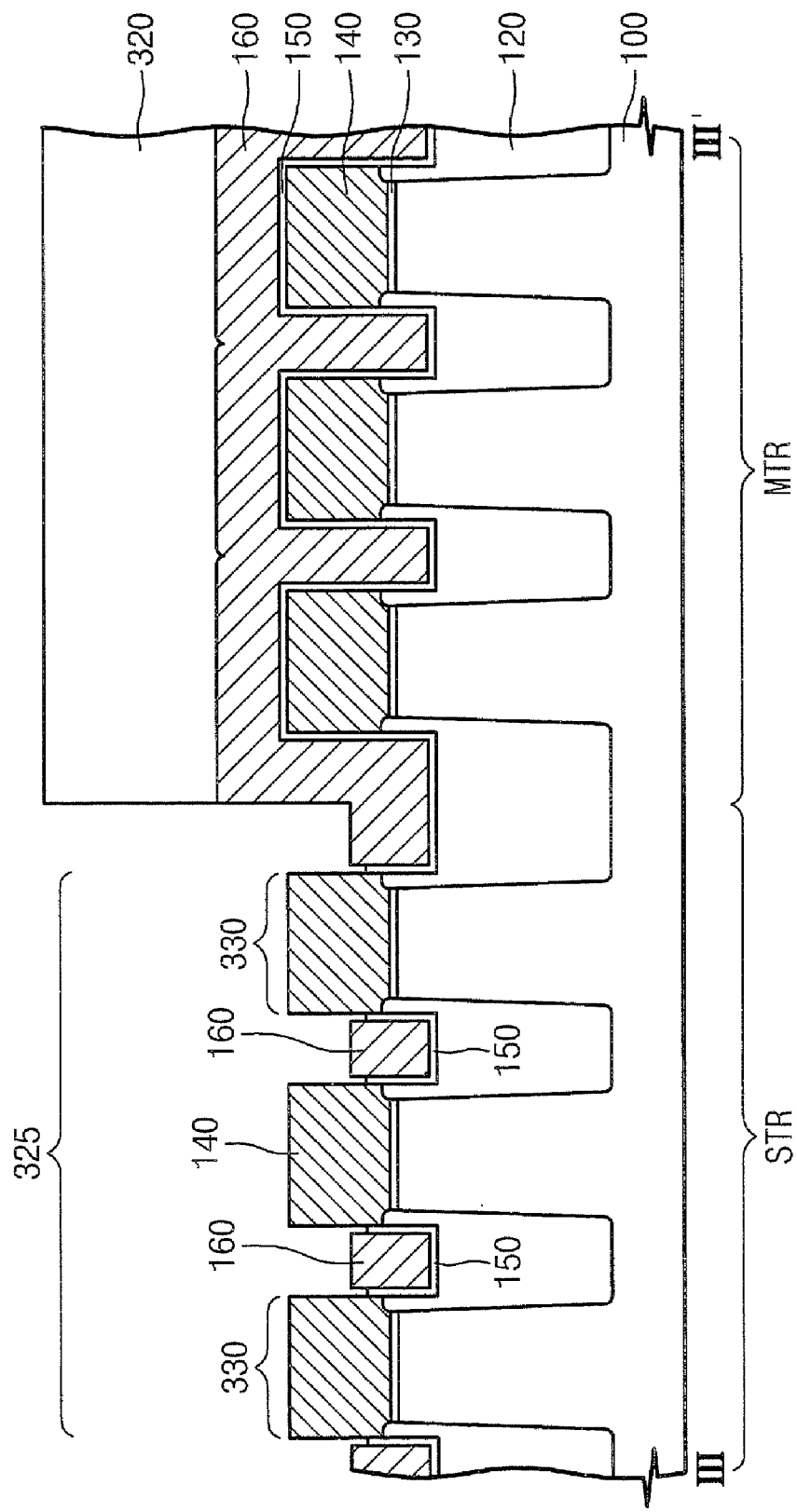
Figure 5C:
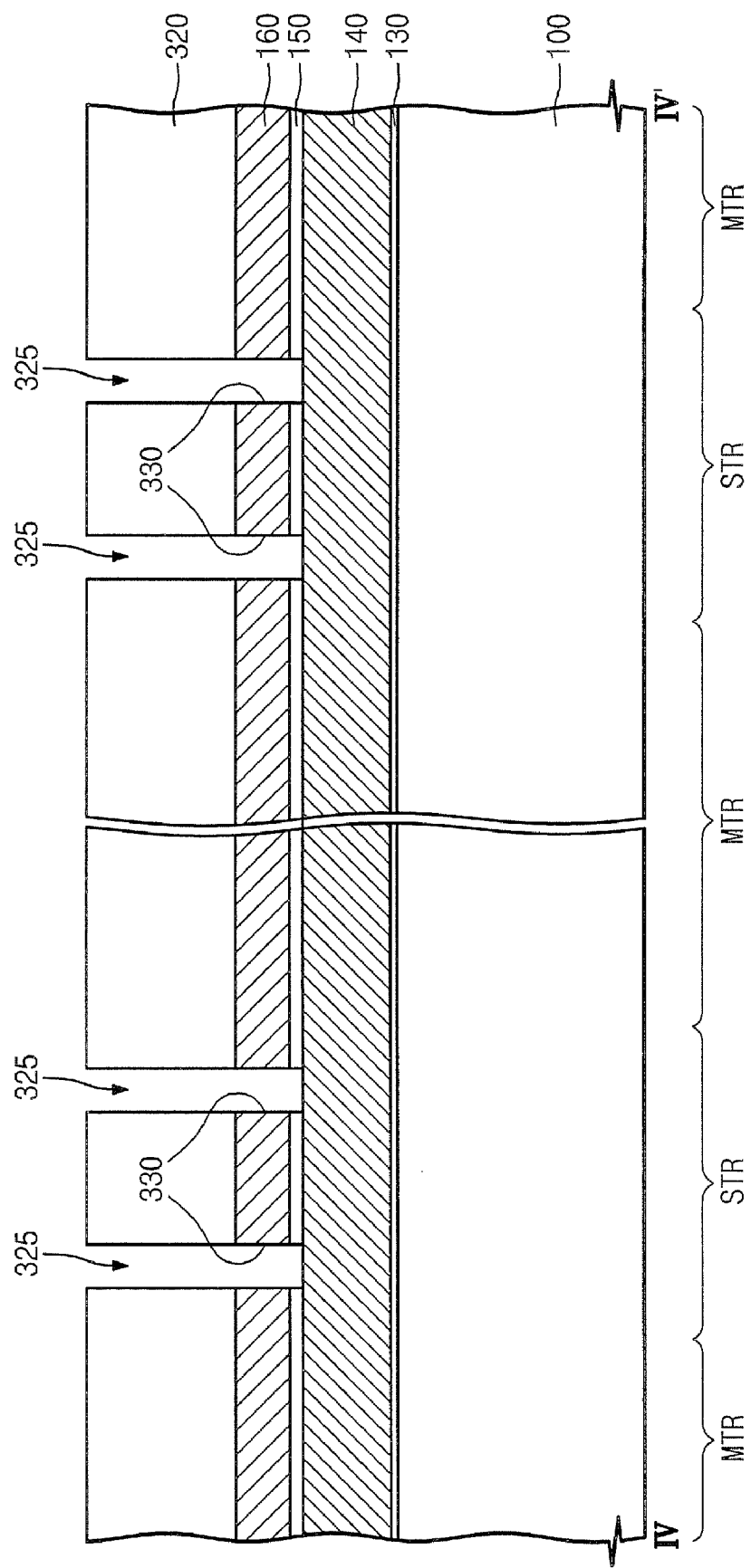

Referring to FIGS. 5A through 5C, a first control conductive layer 160 is formed on the entire top surface of the resultant structure having the inter-gate dielectric layer 150. The first control conductive layer 160 may be a polysilicon layer obtained using a CVD technique and formed to a thickness greater than half the distance between the floating conductive patterns 140 so that the first control conductive layer 160 fills the grooves 300 between the floating conductive patterns 140. In this case, a time interval between the formation of the first control conductive layer 160 and the formation of the inter-gate dielectric layer 150 may be minimized in order to prevent change in the characteristic of the inter-gate dielectric layer 150.

A mask pattern 320 is formed on the resultant structure having the first control conductive layer 160. The mask pattern 320 includes mask openings 325 to expose portions of a top surface of the first control conductive layer 160 in the STR. The mask pattern 320 may be formed of a material having an etch selectivity with respect to the first control conductive layer 160. Preferably, the mask pattern 320 may be a photoresist pattern obtained using a photolithography process.

In one embodiment of the present invention, the mask opening 325 exposes the first control conductive layer 160 in a region where ground and string selection transistors are to be formed, and is formed across the active region ACT. That is, the mask pattern 320 is formed to cover the entire surface of the MTR and a portion (i.e., a region where a common source electrode and a bit line contact will be formed) of the STR. However, the shape and positions of the mask openings 325 may be varied in other embodiments of the invention.

Thereafter, the first control conductive layer 160 and the inter-gate dielectric layer 150 are etched using the mask pattern 320 as an etch mask, thereby exposing a top surface of the floating conductive pattern 140. According to some embodiments of the present invention, an upper sidewall of the floating conductive pattern 140 may be exposed in the mask opening 325. In other words, the first control conductive layer 160 has a top surface lower than the top surface of the floating conductive pattern 140 in the mask opening 325. However, the top surface of the first control conductive layer 160 is formed to a higher level than the bottom surface of the floating conductive pattern 140 in the mask opening 325 such that the isolation pattern 120 is not exposed.

Meanwhile, the first control conductive layer 160 and the inter-gate dielectric layer 150 are not etched in a region covered with the mask pattern 320. Since the mask pattern 320 covers the entire surface of the MTR and a portion of the STR as described above, openings 330 are formed in the inter-gate dielectric layer 150 and the first control conductive layer 160 in the STR to thereby the floating conductive patterns 140 in the mask openings 325. However, according to additional embodiments of the present invention, the mask opening 325 is different in width from the opening 330 because the first control conductive layer 160 and the inter-gate dielectric layer 150 remain in the mask opening 325. Specifically, the opening 330 is formed inside the mask opening 325, and a region of the mask opening 325 that is not overlapped by the opening 330 corresponds to an upper portion of the groove 300.

Figure 6A:
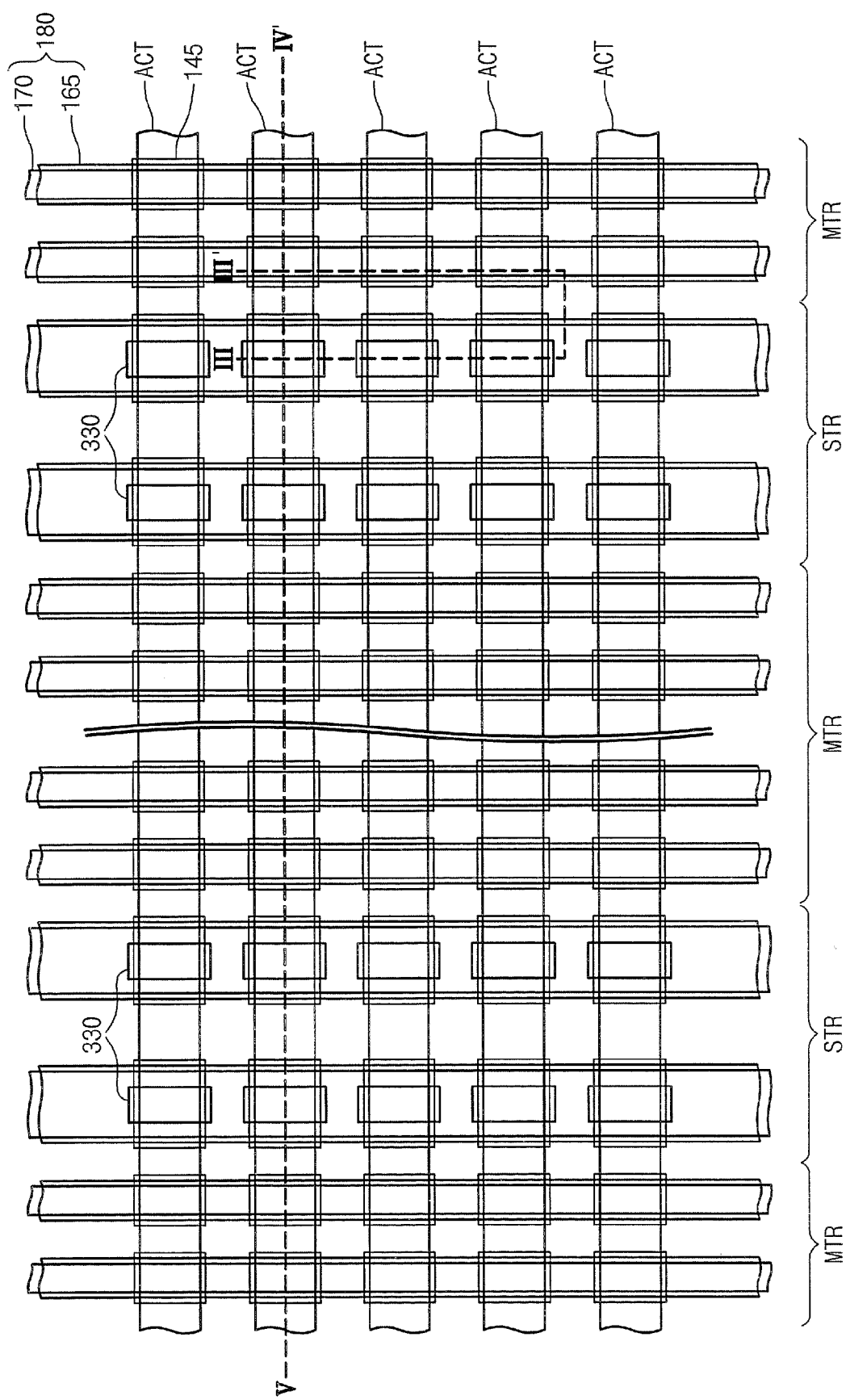
Figure 6B:
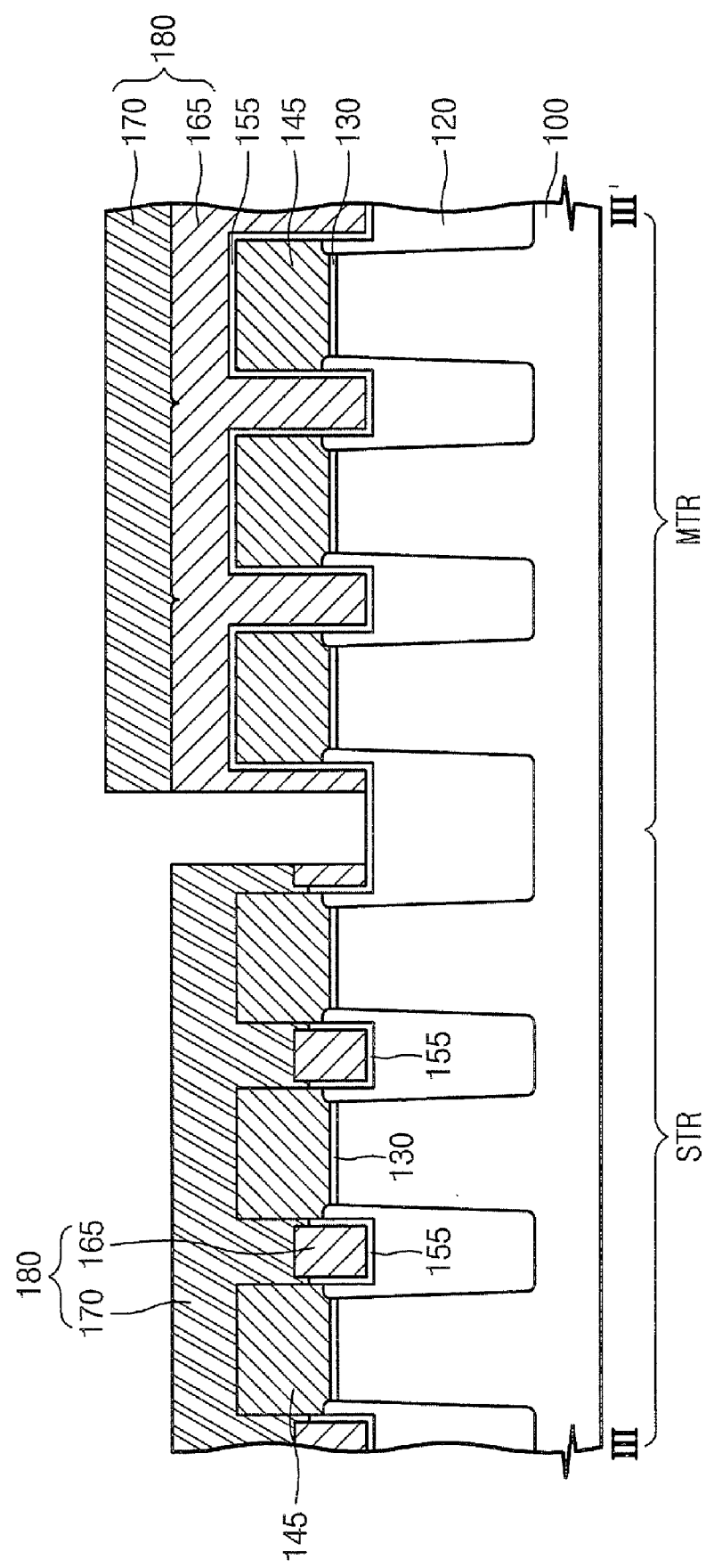
Figure 6C:
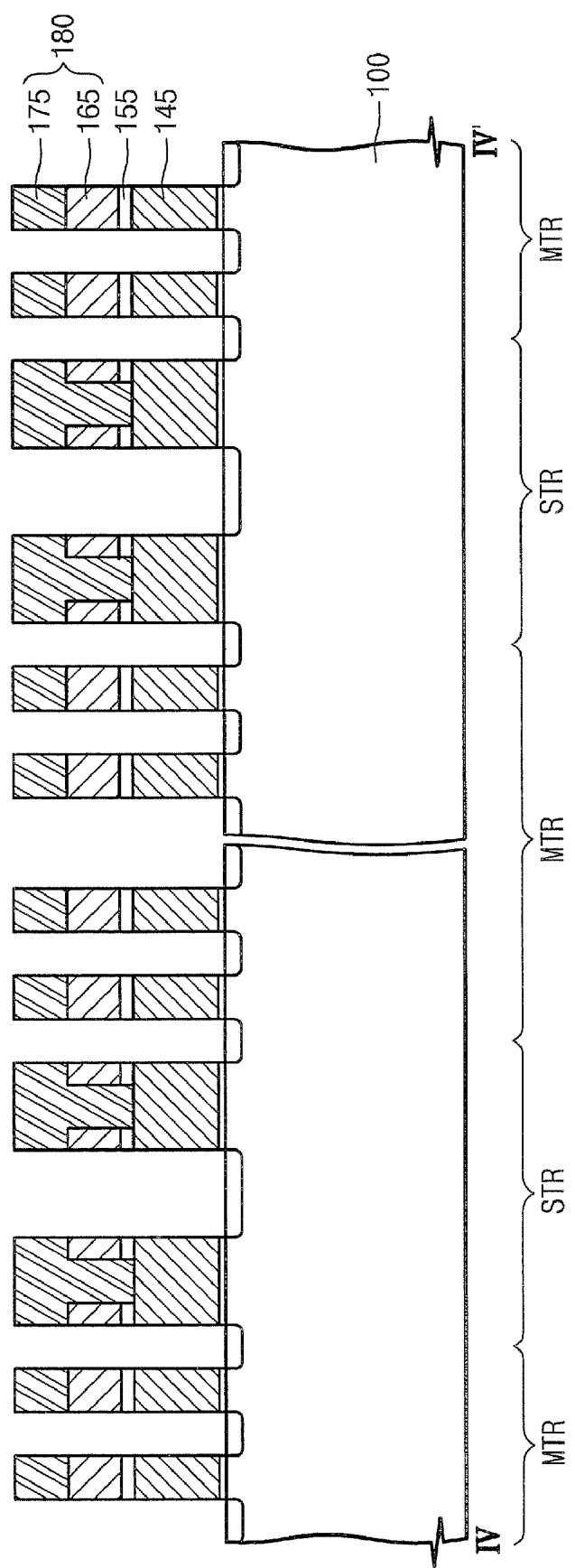

Referring to FIGS. 6A through 6C, the mask pattern 320 is removed to expose the top surface of the first control conductive layer 160. Subsequently, a second control conductive layer is formed on the resultant structure from which the mask pattern 320 is removed. Thus, the second control conductive layer is brought into contact with the top surface of the floating conductive layer 140 through the opening 330. Further, the second control conductive layer is filled between the floating conductive patterns 140 in the STR. However, the second control conductive layer does not contact the isolation pattern 120 because the first control conductive layer 160 fills the grooves 300. The second control conductive layer may be formed of at least one material selected from the group consisting of a polysilicon layer, a silicide layer, and a metal layer. Preferably, the second control conductive layer may include a polysilicon layer and a tungsten silicide layer, which are sequentially stacked. Based on these process steps, the inter-gate dielectric layer 150 does not have the opening 330 in the MTR. Accordingly, the floating conductive pattern 140 is electrically isolated from the first control conductive layer 160 and the second control conductive layer in the MTR.

Thereafter, a photoresist pattern is formed on the second control conductive layer across the active regions ACT, and the second control conductive layer, the first control conductive layer 160, the inter-gate dielectric layer 150, and the floating conductive pattern 160 are sequentially etched through an anisotropic etching process using the photoresist pattern as an etch mask. Thus, the gate patterns are formed to expose the top surfaces of the active region ACT and the isolation pattern 120. More specifically, the gate patterns include floating gate electrodes 145, which are formed on the active region ACT, and an inter-gate dielectric pattern 155, a first control gate electrode 165, and a second control gate electrode 170, which are sequentially stacked on the floating gate electrodes 145 and run across the active region ACT. The floating gate electrode 145, the inter-gate dielectric pattern 155, the first control gate electrode 165, and the second control gate electrode 170 correspond to the resultant structures obtained by anisotropically etching the floating conductive pattern 160, the inter-gate dielectric layer 150, the first control conductive layer 160, and the second control conductive layer, respectively. Also, the first control conductive electrode 165 and the second control conductive electrode 170 constitute a control gate electrode 180 of the NAND flash memory device according to embodiments of the present invention.

Meanwhile, the gate patterns include a memory gate pattern formed in the MTR and a selection gate pattern formed in the STR. In the above-described method, the inter-gate dielectric pattern 155 of the memory gate pattern is disposed between the floating gate electrode 145 and the first control gate electrode 165 so that the floating gate electrode 145 is electrically isolated from the first control gate electrode 165. Thus, the second control gate electrode 170 of the memory gate pattern also is electrically isolated from the floating gate electrode 145.

By comparison, the second control gate electrode 145 of the selection gate pattern is connected to the floating gate electrode 145 through the opening 330 that is formed through the inter-gate dielectric pattern 155 and the first control gate electrode 165. Thus, a voltage applied to the control gate electrode 180 is also applied to the floating gate electrode 145, so that the selection gate pattern can directly use the voltage as a gate voltage.

As described above, the first control gate electrode 165 includes a portion with a top surface lower than the top surface of the floating gate electrode 110 on the isolation pattern 120 in the STR. In this case, the opening 330 exposes an upper sidewall of the floating gate electrode 110. Also, the first control gate electrode 165 of the selection gate pattern, which is disposed on the isolation pattern 120, has a portion with a thickness smaller than the thickness of the first control gate electrode 165 disposed on the isolation pattern 120 in the MTR.

According to embodiments of the present invention, the first control gate electrode 165 is filled between the floating gate electrodes 145 on the isolation pattern 120 in the MTR. However, even if the first control gate electrode 165 may be disposed between the floating gate electrodes 145 on the isolation pattern 120 in the STR, the first control gate electrode 165 is not completely filled between the floating gate electrodes 145. That is, upper spaces that are not filled with the first control gate electrode 165 remain between the floating gate electrodes 145. Thus, the upper spaces that are not filled with the first control gate electrode 165 are ultimately filled with the second control gate electrode 170.

According to embodiments of the present invention as described above, the first control gate electrode is disposed between the isolation pattern and the second control gate electrode. Thus, the second control gate electrode of the selection transistor is out of contact with the isolation pattern. In particular, when the opening is formed to electrically connect the second control gate electrode of the selection transistor with the floating gate electrode, the first control gate electrode remains on the isolation pattern so that the expansion of the isolation pattern can be prevented. Consequently, since a reduction in a distance between the control gate electrode and the active region can be inhibited, leakage current and breakdown voltage characteristics between the control gate electrode of the selection transistor and the active region can improve.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method of forming a flash memory device, comprising the steps of:
   forming first and second trench isolation regions at side-by-side locations in a semiconductor substrate;
   forming a gate electrode of a string selection transistor on a portion of the semiconductor substrate extending between the first and second trench isolation regions;
   forming first and second trenches in the first and second trench isolation regions, respectively;
   depositing an inter-gate dielectric layer on the bottoms and sidewalls of the first and second trenches and on sidewalls and an upper surface of the gate electrode;
   depositing a first control conductive layer on the inter-gate dielectric layer;
   selectively etching the first control conductive layer and the inter-gate dielectric layer in sequence to expose the sidewalls and the upper surface of the gate electrode and define first and second control gate electrode segments that are separated from bottoms and sidewalls of the first and second trenches, respectively, by first and second inter-gate dielectric layer segments ; and
   forming a string selection line that extends on the first and second inter-gate dielectric layer segments and electrically contacts an upper surface and sidewalls of the gate electrode by depositing a second control conductive layer directly on the upper surface and sidewalls of the gate electrode and then selectively etching the second control conductive layer and the first control conductive layer in sequence to define the string selection line on the gate electrode and further define a control gate electrode of a memory cell transistor within the flash memory device.

2. A method of fabricating a NAND flash memory device, comprising:
   forming an isolation pattern on a semiconductor substrate including a memory transistor region and a selection transistor region to define an active region;
   sequentially stacking a gate insulating layer and a floating conductive pattern on the active region;
   sequentially stacking an inter-gate dielectric layer and a first control conductive layer on the resultant structure having the floating conductive pattern;
   forming an opening to expose a top surface of the floating conductive pattern in the selection transistor region by patterning the first control conductive layer and the inter-gate dielectric layer;
   forming a second control conductive layer that is in contact with the top surface of the floating conductive pattern through the opening;
   forming a memory gate pattern and a selection gate pattern by patterning the second control conductive layer, the first control conductive layer, the inter-gate dielectric layer, and the floating conductive pattern, each gate pattern including a floating gate electrode, an inter-gate dielectric pattern, a first control gate electrode, and a second control gate electrode that are sequentially stacked,
   wherein the memory gate pattern and the selection gate pattern are formed in the memory transistor region and the selection transistor region, respectively, and run across the active region;
   wherein the exposing of the top surface of the floating conductive pattern is performed so that the first control conductive layer is left on the isolation pattern in the selection transistor region.

3. The method of claim 2 , before forming the inter-gate dielectric layer, further comprising forming a groove with a bottom surface lower than a bottom surface of the floating conductive pattern by recessing the isolation pattern between the floating conductive patterns.

4. The method of claim 3 , wherein the forming of the opening comprises:
   forming a mask pattern to cover the memory transistor region and expose a portion of the selection transistor region;
   etching the first control conductive layer and the inter-gate dielectric layer using the mask pattern as an etch mask until a portion of the top surface of the floating conductive pattern is exposed in the selection transistor region; and
   removing the mask pattern,
   wherein the etching of the first control conductive layer and the inter-gate dielectric layer is performed so that the first control conductive layer is left on the groove.

5. The method of claim 2, wherein the forming of the isolation pattern comprises:
   forming a trench mask pattern on the active region;
   forming an isolation trench to define the active region by anisotropically etching the semiconductor substrate using the trench mask pattern as an etch mask;
   forming an isolation layer to fill the isolation trench; and
   forming the isolation pattern to fill the isolation trench by planarizing the isolation layer until a top surface of the trench mask pattern is exposed.

6. The method of claim 5, wherein the forming of the gate insulating layer and the floating conductive pattern comprises:
   forming a gap region by removing the trench mask pattern, the gap region enclosed with the isolation pattern and exposing a top surface of the active region;
   forming the gate insulating layer on the exposed active region;

forming a floating conductive layer on the resultant structure including the gate insulating layer to fill the gap region; and forming the floating conductive pattern by planarizing the floating conductive layer until a top surface of the isolation pattern is exposed, the floating conductive pattern formed in a self-aligned manner on the active region.

7. The method of claim 6, wherein the removing of the trench mask pattern includes isotropically etching a sidewall of the isolation pattern that protrudes over the active region so that the gap region is formed to a greater width than the trench mask pattern.

8. The method of claim 2, wherein the inter-gate dielectric pattern of the memory gate pattern is formed between the floating gate electrode and the first control gate electrode and electrically isolates the floating gate electrode from the first control gate electrode, the first control gate electrode of the memory gate pattern is formed between the inter-gate dielectric pattern and the second control gate electrode and filled between the groove and the floating gate electrodes, the inter-gate dielectric pattern and the first control gate electrode of the selection gate pattern are formed between the floating gate electrode and the second control gate electrode and include the opening to expose a top surface of the floating gate electrode, and the second control gate electrode of the selection gate pattern is connected to the floating gate electrode through the opening.

* * * * *